(12) United States Patent
Wagoner et al.

(10) Patent No.: US 10,826,306 B2
(45) Date of Patent: Nov. 3, 2020

(54) SYSTEM AND METHOD FOR MONITORING ULTRACAPACITORS

(71) Applicant: General Electric Company, Schenectady, NY (US)

(72) Inventors: Robert Gregory Wagoner, Roanoke, VA (US); Jeffrey Alan Melius, Roanoke, VA (US); Christopher Lee Tschappatt, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 141 days.

(21) Appl. No.: 16/131,607

(22) Filed: Sep. 14, 2018

(65) Prior Publication Data

US 2020/0091739 A1 Mar. 19, 2020

(51) Int. Cl.

| F03D 17/00 | (2016.01) |
|---|---|
| H02J 7/00 | (2006.01) |
| G01R 31/36 | (2020.01) |
| F03D 7/02 | (2006.01) |
| G01R 19/00 | (2006.01) |
| G01R 27/26 | (2006.01) |

(Continued)

(52) U.S. Cl.
CPC .......... *H02J 7/0026* (2013.01); *F03D 7/0224* (2013.01); *F03D 7/0264* (2013.01); *F03D 17/00* (2016.05); *G01R 19/003* (2013.01); *G01R 27/2605* (2013.01); *G01R 31/3647* (2019.01); *H02H 1/0007* (2013.01); *H02H 7/06* (2013.01); *F05B 2260/74* (2013.01); *F05B 2260/80* (2013.01); *F05B 2260/83* (2013.01); *H02J 7/345* (2013.01)

(58) Field of Classification Search
CPC . H02J 7/0026; G01R 31/3647; G01R 19/003; G01R 27/2605; F03D 17/00; F03D 7/0224–0228; F03D 7/0264; H02H 1/0007; H02H 7/06
See application file for complete search history.

(56) References Cited

U.S. PATENT DOCUMENTS

| 8,933,577 B2 * | 1/2015 | Ahnert ................. F03D 7/0224 290/55 |
|---|---|---|
| 9,643,729 B2 | 5/2017 | Walter-Robinson |

(Continued)

FOREIGN PATENT DOCUMENTS

WO    WO2017/106410 A1    6/2017

OTHER PUBLICATIONS

European Search Report, dated Oct. 23, 2019.

*Primary Examiner* — Patrick Assouad
*Assistant Examiner* — Demetrius R Pretlow
(74) *Attorney, Agent, or Firm* — Dority & Manning, P.A.

(57) ABSTRACT

A method for monitoring a bank of ultracapacitors configured to power an alternating current (AC) pitch motor of a pitch system in a wind turbine is provided. The method includes obtaining, by one or more control devices, data indicative of a voltage associated with the bank of ultracapacitors. The method includes conducting, by the one or more control devices, a test operation of the bank of ultracapacitors at predetermined intervals of time to determine a capacitance associated with the bank of ultracapacitors. The method further includes performing, by the one or more control devices, one or more control actions based, at least in part, on the capacitance or the data indicative of the voltage.

17 Claims, 13 Drawing Sheets

(51) Int. Cl.
  *H02H 1/00* (2006.01)
  *H02H 7/06* (2006.01)
  *H02J 7/34* (2006.01)

(56) References Cited

U.S. PATENT DOCUMENTS

| | | | | |
|---|---|---|---|---|
| 2005/0041370 A1* | 2/2005 | Wilk | ............ | H01G 9/008 |
| | | | | 361/502 |
| 2005/0280968 A1* | 12/2005 | Grundmann | ............ | H02H 7/16 |
| | | | | 361/91.1 |
| 2006/0241876 A1* | 10/2006 | Ingram | ............ | H02J 7/0019 |
| | | | | 702/57 |
| 2009/0273236 A1* | 11/2009 | Broesse | ............ | H02J 7/1423 |
| | | | | 307/9.1 |
| 2010/0026248 A1* | 2/2010 | Barrade | ............ | H02J 7/342 |
| | | | | 320/166 |
| 2010/0052625 A1* | 3/2010 | Cagno | ............ | G01R 31/64 |
| | | | | 320/166 |
| 2010/0146333 A1* | 6/2010 | Yong | ............ | G06F 1/305 |
| | | | | 714/14 |
| 2010/0270859 A1* | 10/2010 | Gong | ............ | B60L 3/0046 |
| | | | | 307/9.1 |
| 2011/0031811 A1* | 2/2011 | Park | ............ | H02J 7/345 |
| | | | | 307/66 |
| 2011/0134620 A1* | 6/2011 | Kang | ............ | G06K 19/07732 |
| | | | | 361/783 |
| 2011/0157771 A1* | 6/2011 | Gibson | ............ | H01G 9/02 |
| | | | | 361/500 |
| 2011/0181045 A1* | 7/2011 | Letas | ............ | F03D 7/0224 |
| | | | | 290/44 |
| 2012/0038328 A1* | 2/2012 | Khan | ............ | H01G 9/155 |
| | | | | 320/167 |
| 2013/0088010 A1* | 4/2013 | Ahnert | ............ | F03D 7/0224 |
| | | | | 290/44 |
| 2014/0062200 A1* | 3/2014 | Stupka | ............ | H02J 7/345 |
| | | | | 307/64 |
| 2015/0049415 A1* | 2/2015 | Tsukada | ............ | H01G 11/06 |
| | | | | 361/502 |
| 2015/0330116 A1* | 11/2015 | Dente | ............ | B60L 58/25 |
| | | | | 307/10.1 |
| 2017/0063106 A1* | 3/2017 | Armstrong | ............ | H02J 7/0077 |
| 2017/0107747 A1* | 4/2017 | Dente | ............ | E05B 81/04 |
| 2017/0222451 A1* | 8/2017 | Peng | ............ | H02J 7/0091 |
| 2017/0358932 A1* | 12/2017 | Kleffel | ............ | H02J 7/0021 |
| 2018/0171987 A1* | 6/2018 | Yao | ............ | H02J 3/386 |
| 2018/0372054 A1* | 12/2018 | Chen | ............ | H02J 7/0021 |
| 2019/0074710 A1* | 3/2019 | Hansen | ............ | H01G 11/14 |
| 2020/0055472 A1* | 2/2020 | Kageyama | ............ | B60R 16/03 |

* cited by examiner

SYSTEM AND METHOD FOR MONITORING ULTRACAPACITORS

FIELD

The present disclosure relates generally to monitoring a bank of ultracapacitors for fault conditions indicative of an inability of the ultracapacitors to power a pitch drive system of a wind power system during an adverse condition, such as grid loss.

BACKGROUND

Ultracapacitors can be used to provide power in a variety of different applications. An ultracapacitor can lose the ability to provide sufficient voltage to power a load as the ultracapacitor ages. For instance, as an ultracapacitor approaches end of life, an output voltage the ultracapacitor provides to a load can drop quickly. The inability of the ultracapacitor to provide a required output voltage to power a load in certain condition can pose many challenges. For instance, the inability of an ultracapacitor to power a load in a pitch drive system of a wind turbine system can result in an inability to pitch a wind turbine blade on a wind turbine, potentially leading to damage to the wind turbine.

BRIEF DESCRIPTION

Aspects and advantages of the invention will be set forth in part in the following description, or may be obvious from the description, or may be learned through practice of the invention.

In one aspect, a method for monitoring a bank of ultracapacitors configured to power an alternating current (AC) pitch motor of a pitch system in a wind turbine is provided. The method includes obtaining, by one or more control devices, data indicative of a voltage associated with the bank of ultracapacitors. The method includes conducting, by the one or more control devices, a test operation of the bank of ultracapacitors at predetermined intervals of time to determine a capacitance associated with the bank of ultracapacitors. The method further includes performing, by the one or more control devices, one or more control actions based, at least in part, on the capacitance or the data indicative of the voltage.

In another aspect, a system for monitoring operation of a bank of ultracapacitors configured to power an AC pitch motor of a pitch system in a wind turbine is provided. The system includes a charging circuit configured to charge the ultracapacitors. The system includes a resistive load to which the ultracapacitors can be coupled. The system includes a current sensor configured to measure a discharge current of the ultracapacitors. The system includes a control device configured to perform operations. The operations include coupling the ultracapacitors to the charging circuit to charge the ultracapacitors to a charging voltage. Once the ultracapacitors have been charged to the charging voltage, the operations include coupling the ultracapacitors to the resistive load to discharge through the load. While the ultracapacitors are coupled to the resistive load, the operations include obtaining, via the current sensor, data indicative of a discharge current of the ultracapacitors. The operations include determining a capacitance of the ultracapacitors based, at least in part, on the discharge current. The operations include performing one or more control actions based, at least in part, on the capacitance.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
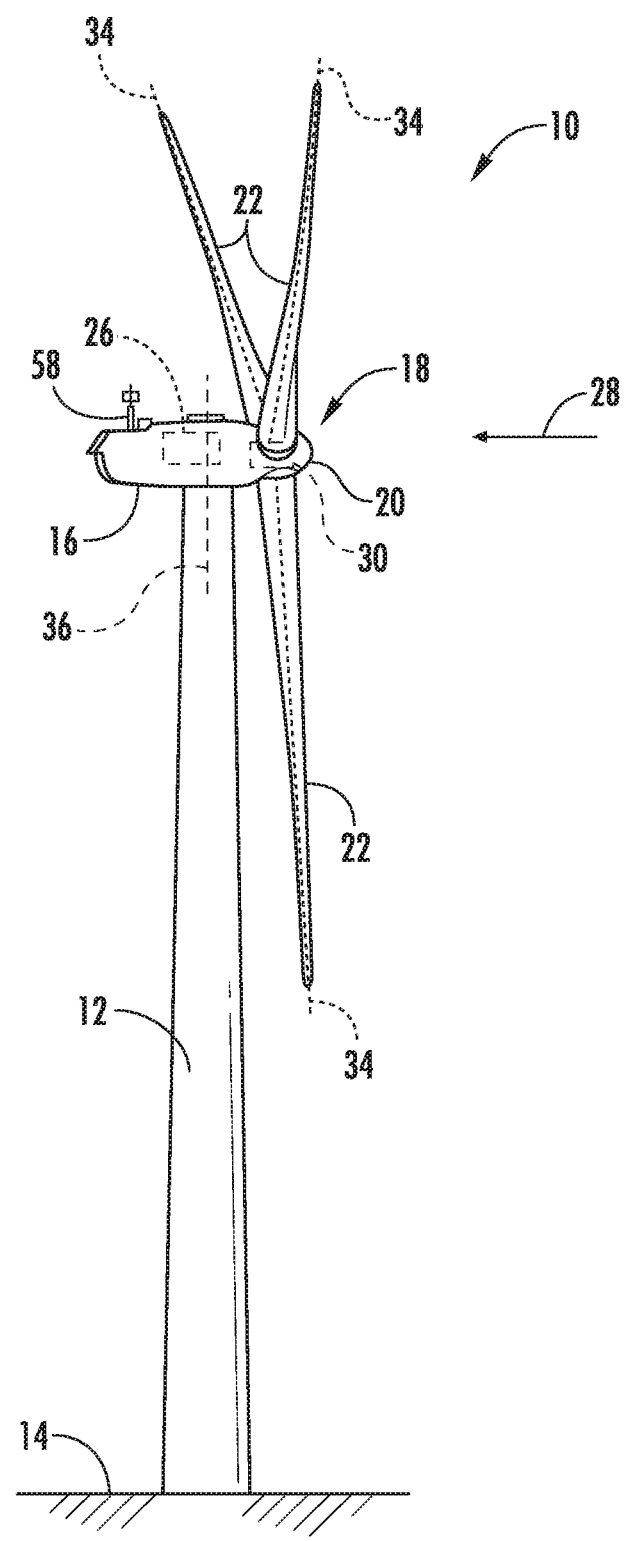
FIG. 1 depicts a perspective view of a wind turbine according to one embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to a method for monitoring a bank of ultracapacitors used to power an alternating current (AC) motor of a pitch system in a wind turbine. The method includes obtaining data indicative of a voltage associated with the bank of ultracapacitors. In example embodiments, the data indicative of the voltage can comprise data indicative of a total voltage across the bank of ultracapacitors. Alternatively and/or additionally, the data indicative of the voltage can comprise data indicative of a voltage associated with one or more segments of a plurality of segments of the bank of ultracapacitors. For example, the bank of ultracapacitors can be divided into eight segments, and each of the eight segments can include one or more ultracapacitors. As will be discussed below in more detail, one or more control devices (e.g., a pitch controller) of the wind turbine can be configured to perform one or more control actions based, at least in part, on the data indicative of the voltage.

When the total voltage is less than a first threshold voltage indicative of a voltage needed to operate the AC pitch motor of the pitch system, the one or more control devices can perform a control action associated with providing a notification indicative of a fault condition (e.g., under voltage) associated with the bank of ultracapacitors. Additionally and/or alternatively, the control device can perform a control action associated with shutting down the wind turbine. In this manner, potential harm to the bank of ultracapacitors or the wind turbine itself can be avoided.

When the total voltage is greater than the first threshold voltage but less than a second threshold voltage indicative of the bank of ultracapacitors being fully-charged, the one or more control devices can be configured to perform a control action associated with coupling the bank of ultracapacitors to a charging circuit via operation of one or more switching elements. In example embodiments, the bank of ultracapacitors can remain coupled to the charging circuit until the total voltage is equal to the threshold voltage. Once the bank of ultracapacitors is fully charged, the one or more control devices can be configured to decouple the bank of ultracapacitors from the charging circuit. In this manner, the control devices can control charging of the bank of ultracapacitors based, at least in part, on the total voltage.

When the total voltage is greater than a threshold voltage indicative of a rated voltage of the bank of ultracapacitors, the one or more control devices can be configured to perform a control action associated with providing a notification indicative of a fault condition (e.g., overvoltage) associated with the bank of ultracapacitors. Additionally and/or alternatively, the one or more control devices can perform a control action associated with shutting down the wind turbine. In this manner, potential harm to the bank of ultracapacitors or the wind turbine itself can be avoided.

In example embodiments, the method for monitoring the bank of ultracapacitors can include conducting a test operation of the bank of ultracapacitors to determine a capacitance of the bank of ultracapacitors. For example, the test operation can be initiated by coupling the bank of ultracapacitors to a charging circuit to charge the bank of ultracapacitors to a charging voltage that is greater than a nominal voltage by a predetermined amount (e.g., 10 Volts). Once the bank of ultracapacitors is charged to the charging voltage, the bank of ultracapacitors can be coupled to a resistive load such that the bank of ultracapacitors can discharge through the resistive load. While the bank of ultracapacitors discharge through the resistive load, data indicative of a discharge current associated with the bank of ultracapacitors can be obtained. Additionally and/or alternatively, data indicative of a rate of discharge of the bank of ultracapacitors can be obtained.

In some embodiments, one or more control devices implementing the test operation can be configured to determine whether the bank of ultracapacitors returns to the nominal voltage within a predetermined amount of time (e.g., two seconds) after coupling the bank of ultracapacitors to the resistive load. If the bank of ultracapacitors do not return to the nominal voltage within the predetermined amount, the one or more control devices can perform a control action associated with providing a notification indicative of a fault condition (e.g., loss of capacitance) associated with the bank of ultracapacitors. Additionally and/or alternatively, the one or more control device can perform a control action associated with shutting down the wind turbine.

If, however, the one or more control devices determine the bank of ultracapacitors does return to the nominal voltage within the predetermined amount of time, test operation can proceed. More specifically, the capacitance of the bank of ultracapacitors can be determined based, at least in part, on the discharge current and the rate of discharge of the bank of ultracapacitors. In example embodiments, the capacitance determined during the test operation can be a total capacitance of the bank of ultracapacitors. Alternatively and/or additionally, the capacitance can be a capacitance associated with one or more segments of the plurality of segments of the bank of ultracapacitors. As will be discussed below in more detail, the method for monitoring the bank of ultracapacitors can include performing one or more control actions based, at least in part, on the capacitance of the bank of ultracapacitors.

When the total capacitance of the bank of ultracapacitors is less than a nominal capacitance indicative of a threshold capacitance needed to operate the AC motor of the pitch system, the one or more control devices can perform a control action associated with providing a notification or alert indicative of a need to perform a maintenance action (e.g., repair or replace) on the bank of ultracapacitors. In some embodiments, the one or more control devices can perform a control action associated with providing a notification indicative of a fault condition (e.g., loss of capacitance) associated with the bank of ultracapacitors. Alternatively and/or additionally, the one or more control devices can perform a control action associated with shutting down the wind turbine to avoid potential harm to the bank or ultracapacitors or the wind turbine itself.

The present disclosure provides numerous technical benefits. For instance, the one or more control devices implementing the method of the present disclosure can detect one or more fault conditions indicative of degraded performance of the bank of ultracapacitors. For instance, the one or more control devices of the present disclosure can determine one or more fault conditions (e.g., under voltage and overvoltage) based, at least in part, on the voltage of the bank of ultracapacitors. Additionally, the one or more control devices can determine fault conditions (e.g., loss of capacitance) based, at least in part, on the capacitance of the bank of ultracapacitors. In this manner, the one or more control devices can take precautionary actions (e.g., shut down) based on detected fault conditions and avoid potential harm to the bank of ultracapacitors and the wind turbine.

As used herein the use of the term "about" in conjunction with a numerical value is intended to refer to within 20% of the stated amount. The use of the term "obtaining" or "obtain" can include receiving, determining, calculating, accessing, reading or otherwise obtaining data.

Aspects of the present disclosure are discussed with reference to a capacitor used to power a pitch system in a wind turbine. Those of ordinary skill in the art, using the disclosures provided herein, will understand that aspects of the present embodiments can be used with other applications without deviating from the scope of the present disclosure.

Referring now to the drawings, FIG. 1 illustrates a perspective view of one embodiment of a wind turbine 10 according to example aspects of the present disclosure. As shown, the wind turbine 10 includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, the hub 20 may be rotatably coupled to an electric generator 24 (FIG. 2) positioned within the nacelle 16 to permit electrical energy to be produced.

Figure 2:
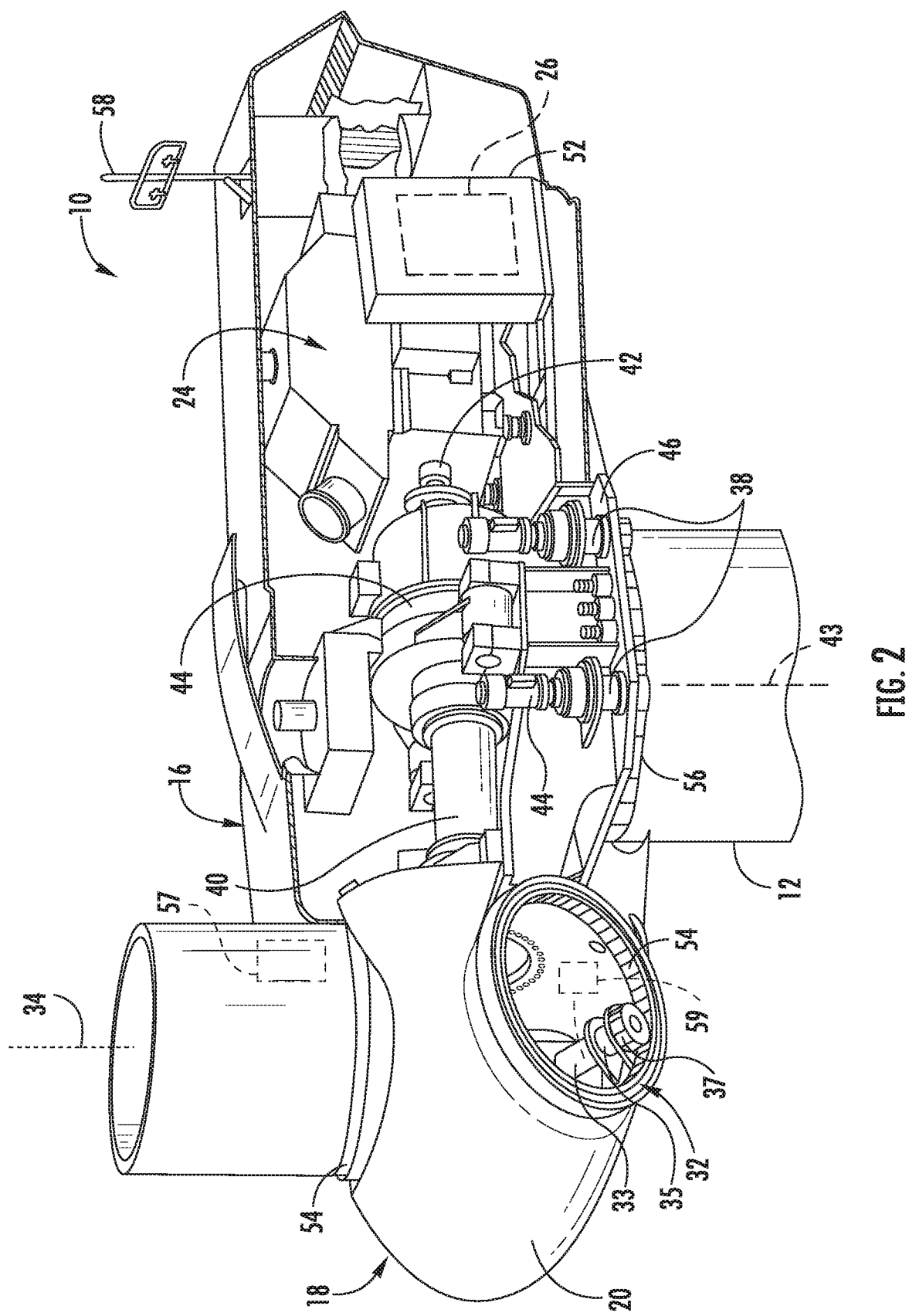
FIG. 2 depicts a perspective, internal view of a nacelle of a wind turbine according to one embodiment of the present disclosure.

Referring now to FIG. 2, a simplified, internal view of one embodiment of the nacelle 16 of the wind turbine 10 is illustrated. As shown, a generator 24 may be disposed within the nacelle 16. The generator 24 may be coupled to the rotor 18 of the wind turbine 10. In this manner, rotational energy generated by the rotor 18 can be converted into electrical power. In example embodiments, the rotor 18 may include a main shaft 40 coupled to the hub 20 for rotation therewith. The generator 24 may then be coupled to the main shaft 40 such that rotation of the main shaft 40 drives the generator 24. For instance, in the illustrated embodiment, the generator 24 includes a generator shaft 42 rotatably coupled to the main shaft 40 through a gearbox 44. However, in other embodiments, it should be appreciated that the generator shaft 42 may be rotatably coupled directly to the main shaft 40. Alternatively, the generator 24 may be directly rotatably coupled to the main shaft 40.

It should be appreciated that the main shaft 40 may generally be supported within the nacelle 16 by a support frame or bedplate 46 positioned atop the wind turbine tower 12. For example, the main shaft 40 may be supported by the bedplate 46 via a pair of pillow blocks 48 mounted to the bedplate 46.

As shown in FIGS. 1 and 2, the wind turbine 10 may also include a turbine control system or a turbine controller 26 within the nacelle 16. For example, as shown in FIG. 2, the turbine controller 26 is disposed within a control cabinet 52 mounted to a portion of the nacelle 16. However, it should be appreciated that the turbine controller 26 may be disposed at any location on or in the wind turbine 10, at any location on the support surface 14 or generally at any other location. The turbine controller 26 may generally be configured to control the various operating modes (e.g., start-up or shut-down sequences) and/or components of the wind turbine 10.

Each rotor blade 22 may also include a pitch adjustment mechanism 32 configured to rotate each rotor blade 22 about its pitch axis 34. Further, each pitch adjustment mechanism 32 may include a pitch drive motor 33 (e.g., any suitable electric, hydraulic, or pneumatic motor), a pitch drive gearbox 35, and a pitch drive pinion 37. In such embodiments, the pitch drive motor 33 may be coupled to the pitch drive gearbox 35 so that the pitch drive motor 33 imparts mechanical force to the pitch drive gearbox 35. Similarly, the pitch drive gearbox 35 may be coupled to the pitch drive pinion 37 for rotation therewith. The pitch drive pinion 37 may, in turn, be in rotational engagement with a pitch bearing 54 coupled between the hub 20 and a corresponding rotor blade 22 such that rotation of the pitch drive pinion 37 causes rotation of the pitch bearing 54. Thus, in such embodiments, rotation of the pitch drive motor 33 drives the pitch drive gearbox 35 and the pitch drive pinion 37, thereby rotating the pitch bearing 54 and the rotor blade 22 about the pitch axis 34. Similarly, the wind turbine 10 may include one or more yaw drive mechanisms 38 communicatively coupled to the turbine controller 26, with each yaw drive mechanism(s) 38 being configured to change the angle of the nacelle 16 relative to the wind (e.g., by engaging a yaw bearing 56 of the wind turbine 10).

Further, the turbine controller 26 may also be communicatively coupled to each pitch adjustment mechanism 32 of the wind turbine 10 (one of which is shown) through a separate or integral pitch controller 30 (FIG. 1) for controlling and/or altering the pitch angle of the rotor blades 22 (i.e., an angle that determines a perspective of the rotor blades 22 with respect to the direction 28 of the wind).

In addition, as shown in FIG. 2, one or more sensors 57, 58, 59 may be provided on the wind turbine 10. More specifically, as shown, a blade sensor 57 may be configured with one or more of the rotor blades 22 to monitor the rotor blades 22. Further, as shown, a wind sensor 58 may be provided on the wind turbine 10. For example, the wind sensor 58 may be a wind vane, an anemometer, a LIDAR sensor, or another suitable sensor that measures wind speed and/or direction. In addition, a pitch sensor 59 may be configured with each of the pitch drive mechanism(s) 32, e.g. with a bank of ultracapacitors associated with the pitch drive motors 33 thereof, which will be discussed in more detail below. As such, the sensors 57, 58, 59 may further be in communication with the pitch controller 30, and may provide related information to the pitch controller 30. Additional sensors (not illustrated) can include voltage and current sensors used as part of a test system for conducting test operations of a bank of ultracapacitors to determine a capacitance of the bank of ultracapacitors.

Figure 3:
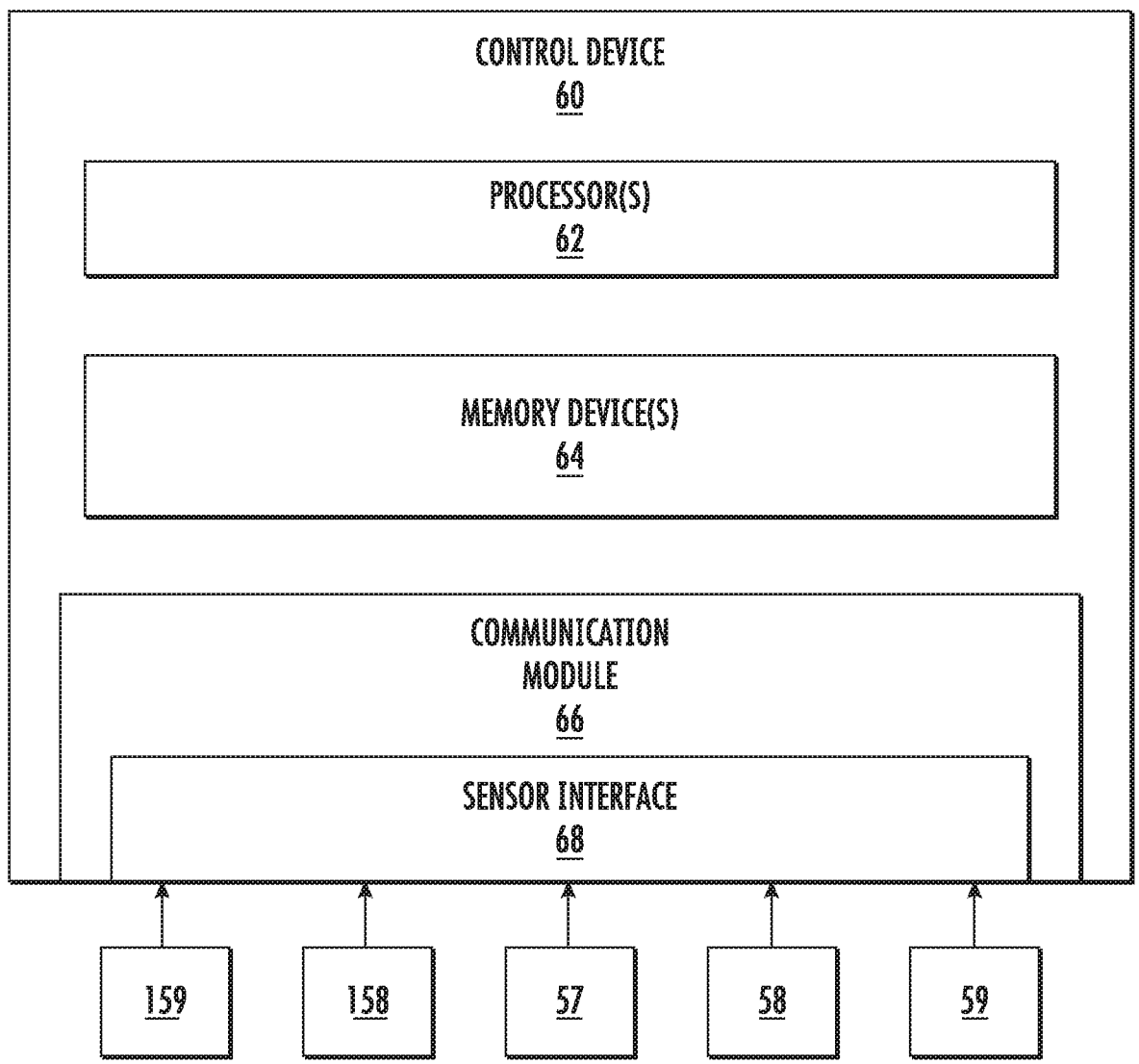
FIG. 3 depicts a schematic diagram of one embodiment of suitable components that may be included in a wind turbine control device according to the present disclosure.

Referring now to FIG. 3, a block diagram of an example control device 60 is provided according to example embodiments of the present disclosure. In general, the control device 60 corresponds to any suitable processor-based device, including one or more computing devices. For instance, FIG. 3 illustrates one embodiment of suitable components that may be included within the control device 60. As shown in FIG. 3, the control device 60 can include a processor 62 and associated memory 64 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory 64 may generally include memory element(s) including, but not limited to, computer readable medium (e.g., random access memory (RAM)), computer readable non-volatile medium (e.g., flash memory), a compact disc-read only memory (CD-ROM), a magneto-optical disk (MOD), a digital versatile disc (DVD) and/or other suitable memory elements or combinations thereof.

Additionally, as shown in FIG. 3, the control device 60 can include a communications module 66 to facilitate communication between the control device 60 and various components of the wind turbine 10 (FIG. 1). For instance, the control device 60 can send control signals via the communications module 66 to switching elements (e.g., relays to couple ultracapacitors to resistive loads and/or a charging circuit).

Further, the communications module 66 can include a sensor interface 68 (e.g., one or more analog-to-digital converters) to permit signals transmitted from one or more sensors 57, 58, 59 to be converted into signals that can be understood and processed by the control device 60. It should be appreciated that the sensors 57, 58, 59 can be communicatively coupled to the communications module 66 using any suitable means. For example, as shown in FIG. 3, the sensors 57, 58, 59 are coupled to the sensor interface 68 via a wired connection. However, in other embodiments, the sensors 57, 58, 59 may be coupled to the sensor interface 68 via a wireless connection, such as by using any suitable wireless communications protocol known in the art.

Other sensors can be in communication with the control device 60. For instance, one or more voltage sensors 158 can be in communication with the control device 60. The one or more voltage sensors 158 can be part of the system for monitoring operation of the bank of ultracapacitors used to power a pitch adjustment mechanism of a wind turbine. As will be discussed below in more detail, the one or more voltage sensor 158 can be configured to measure an output voltage at various locations on the bank of ultracapacitors.

Alternatively and/or additionally, a current sensor 159 can be in communication with the control device 60. The current sensor 159 can be part of the system for monitoring operation of a bank of ultracapacitors. In example embodiments, the current sensor 159 can be configured to measure an output current (e.g., discharge current) of the bank of ultracapacitors when the bank of ultracapacitors is coupled to the resistive load.

Figure 4:
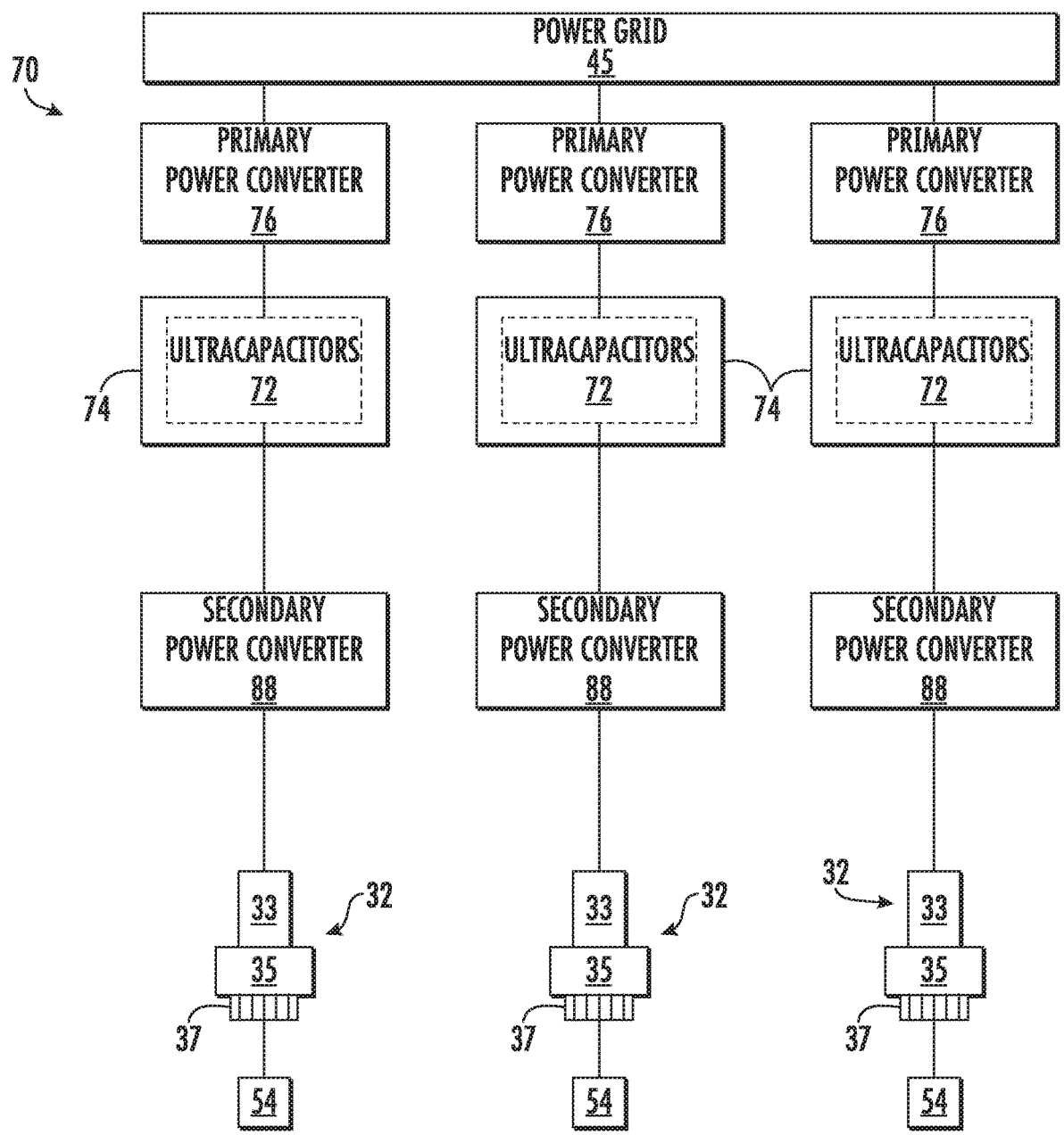
FIG. 4 depicts a schematic diagram of one embodiment of a pitch system of a wind turbine according to the present disclosure.

Referring now to FIG. 4, a schematic diagram of one embodiment of a pitch system 70 for the wind turbine 10 (FIG. 1) is provided. More specifically, as shown, the pitch system 70 includes a plurality of pitch drive mechanisms 32, i.e. one for each pitch axis 34 (FIG. 2). Further, as shown, each of the pitch drive mechanisms 32 may be communicatively coupled to a power grid 45 as well as a bank of ultracapacitors 72. More specifically, as shown, a bank of ultracapacitors 72 associated with each pitch drive mechanism 32 can be stored in a cabinet 74. In some embodiments, the cabinet 74 can be a thermally isolated container.

During normal operation of the wind turbine 10, a primary power converter 76 of the wind turbine 10 (FIG. 1) receives alternating current (AC) power from the power grid 45 and converts the AC power to AC power suitable for driving the pitch drive motors 33 (e.g., AC motors) of each pitch drive mechanism 32. Additionally, the primary power converter 76 can convert AC power received from the power grid 45 into direct current (DC) power suitable for charging the bank ultracapacitors 72. As will be discussed below in more detail, in some instances (e.g., adverse grid event or grid loss), the pitch drive motors 33 may be driven by the bank of ultracapacitors 72.

When pitching of the rotor blades 22 relies on the bank of ultracapacitors 72 (i.e. due to a grid loss), it is important to ensure that the bank of ultracapacitors 72 are capable of operating when needed. Thus, as will be discussed below in more detail, the control device 60 (FIG. 3) is configured to implement a control strategy to monitor the bank of ultracapacitors 72 to reduce or eliminate the potential for damaging loads occurring during an adverse grid event of the wind turbine 10 or any other scenario where the bank of ultracapacitors is used to pitch the rotor blades 22.

Figure 5:
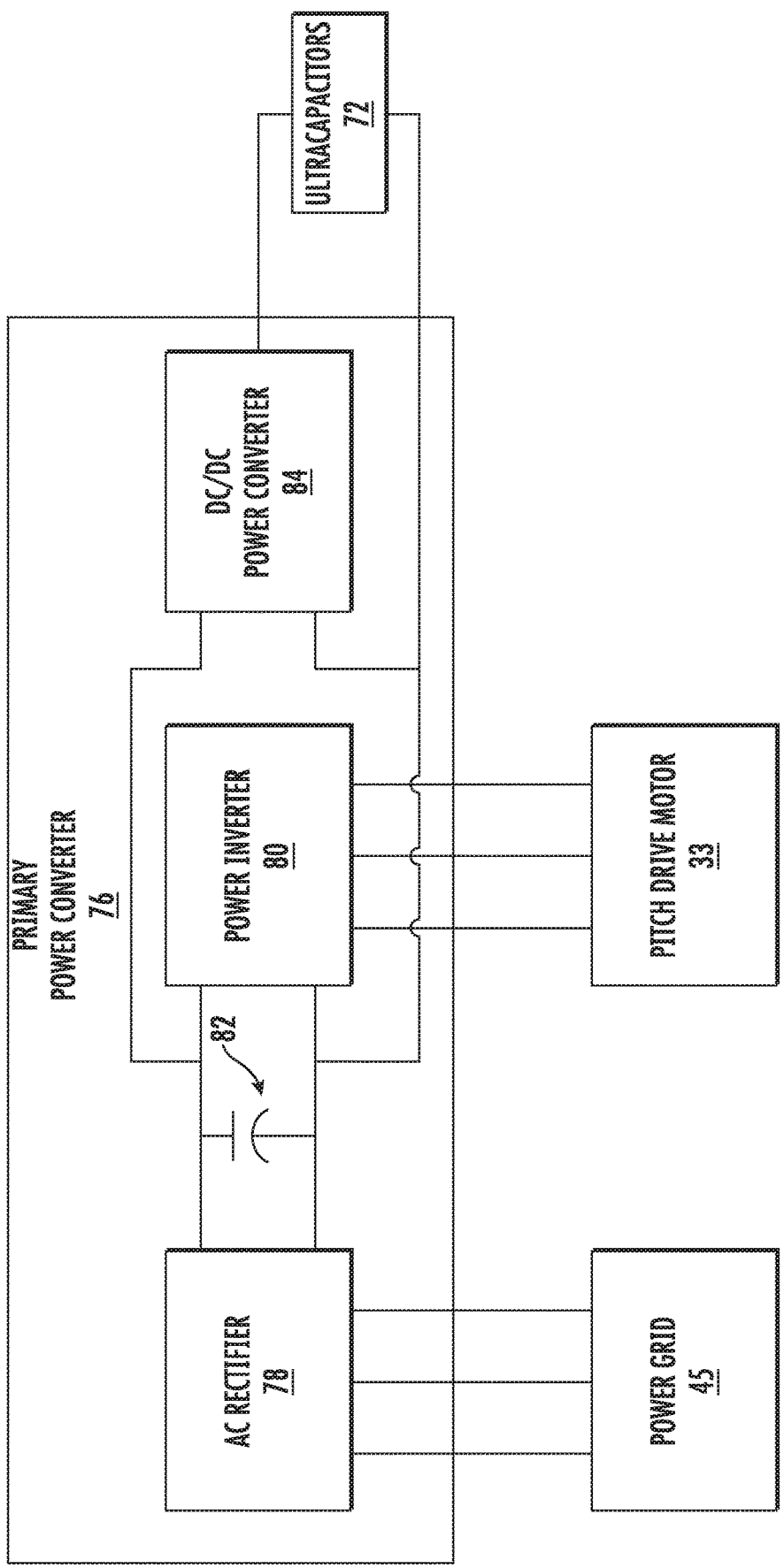
FIG. 5 depicts a schematic diagram of one embodiment of a primary power converter of a wind turbine according to example embodiments of the present disclosure.

FIG. 5 depicts an example embodiment of the primary power converter 76 according to example embodiments of the present disclosure. The primary power converter 76 can include an AC rectifier 78 configured to receive AC power from the power grid 45 at a first AC voltage and convert the first AC voltage to DC power at a first DC voltage. Additionally, the AC rectifier 78 can be coupled to a power inverter 80 of the primary power converter 76. More specifically, the AC rectifier 78 can be coupled to the power inverter 80 via one or more conductors (e.g., wires). In this manner, the output (e.g., DC power at first DC voltage) of the AC rectifier 78 can be provided to the power inverter 80. As shown, the primary power converter 76 can include one or more capacitors 82 (e.g., electrolytic capacitors) coupled between the output of the AC rectifier 78 and the input of the power inverter 80. In example embodiments, the one or more capacitors 82 can be configured to reduce or eliminate noise associated with the DC power the AC rectifier 78 provides to the power inverter 80.

The power inverter 80 can be configured to convert the DC power at the first DC voltage to AC power at a second AC voltage. In example embodiments, the second AC voltage can be different (e.g., greater than or less than) than the first AC voltage associated with the AC power the AC rectifier 78 receives from the power grid 45. As shown, the output (e.g., AC power at the second AC voltage) can be provided to the pitch drive motor 33 of the pitch drive mechanisms 32 (FIG. 4).

The primary power converter 76 can include a DC to DC power converter 84. As shown, the power converter 84 can be coupled to one or more input terminals (e.g., leads) associated with the power inverter 80. In this manner, the power converter 84 can receive the DC power at the first DC voltage. Additionally, the power converter 84 can be coupled to the bank of ultracapacitors 72. In example embodiments, the power converter 84 can convert the DC power at the first DC voltage to DC power at a second DC voltage that is suitable for charging the bank of ultracapacitors 72. It should be appreciated that the second DC voltage can be different (e.g., less than or greater than) than the first DC voltage.

Figure 6:
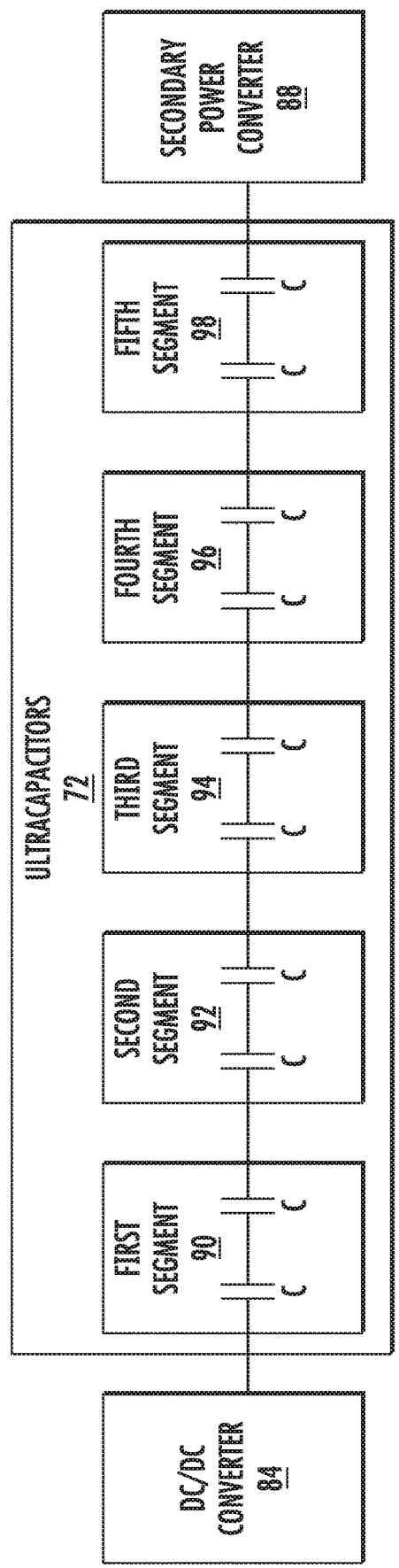
FIG. 6 depicts a schematic diagram of a bank of ultracapacitors according to example embodiments of the present disclosure.

FIG. 6 depicts the bank of ultracapacitors 72 according to example embodiments of the present disclosure. As shown, the bank of ultracapacitors 72 can include a plurality of segments. For instance, the bank of capacitors 72 depicted in FIG. 6 include a first segment 90, a second segment 92, a third segment 94, a fourth segment 96, and a fifth segment 98. In other embodiments, the bank of ultracapacitors 72 can include more or fewer segments. For instance, in some embodiments, the bank of ultracapacitors 72 can include eight segments.

As shown, each segment of the plurality of segments can include a pair of ultracapacitors C arranged in a series configuration. In other embodiments, each segment can include more or fewer ultracapacitors C. Additionally, the ultracapacitors C within each segment can be arranged in any suitable configuration. For instance, in some embodiments, the ultracapacitors C included in each of the segments can be arranged in a parallel configuration.

In example embodiments, the plurality of segments can be coupled to one another in succession. For example, the first segment can be coupled to the DC/DC power converter 84 of the primary power converter 76 (FIG. 5); the second segment 92 can be coupled to the first segment 90; the third segment 94 can be coupled to the second segment 92; the fourth segment 96 can be coupled to the third segment 94; and the fifth segment 98 can be coupled to the fourth segment 96. In example embodiments, the fifth segment 98 can be coupled to a secondary power converter 88 of the wind turbine 10 (FIG. 1). As shown in FIG. 5, the secondary power converter 88 can be coupled between the bank of ultracapacitors 72 and the motor 33 (FIG. 4) of the pitch drive mechanism 32 (FIG. 4). In example embodiments, the secondary power converter 88 can receive DC power from the bank of ultracapacitors 72 and convert the DC power to AC power suitable for driving the motor 33 (FIG. 4).

Figure 7:
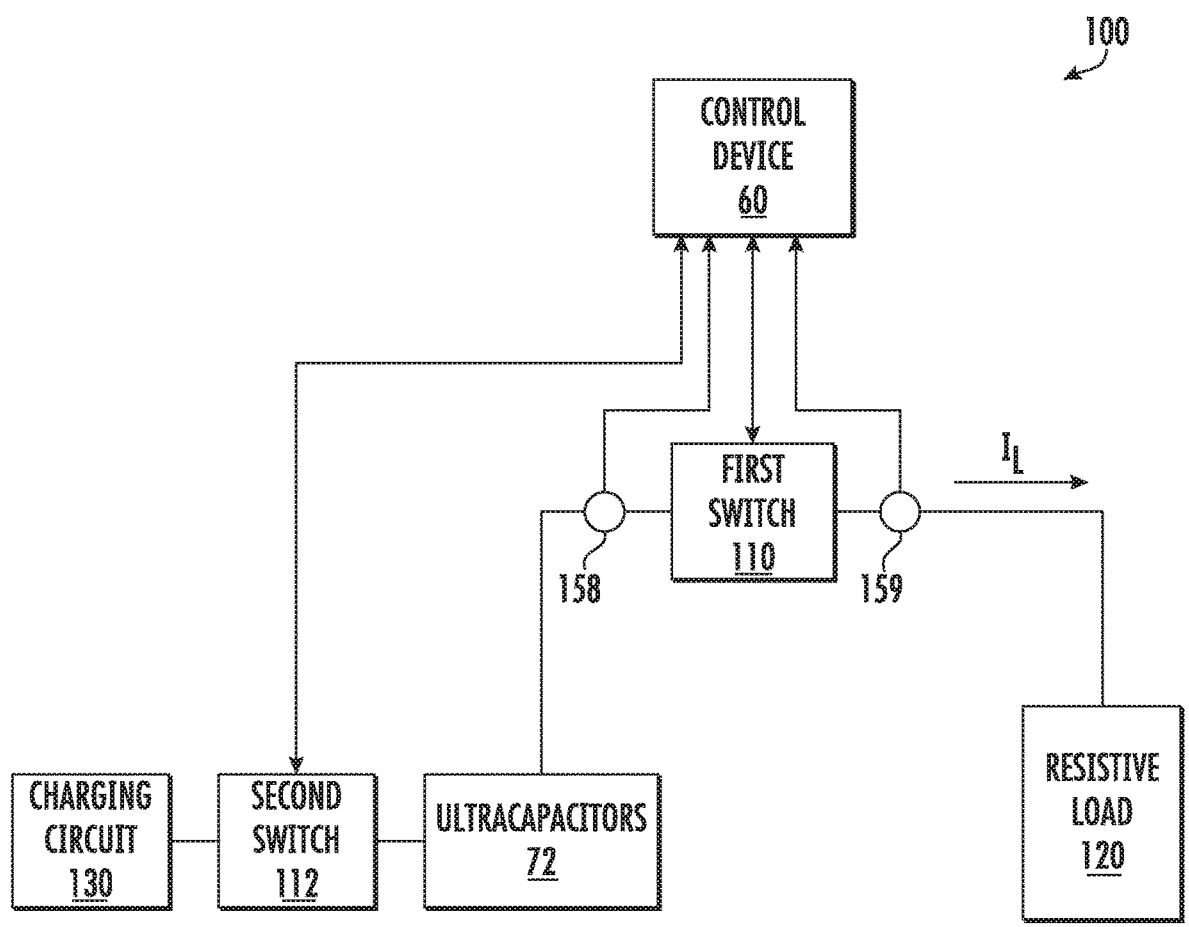
FIG. 7 depicts a system for monitoring operation of a bank of ultracapacitors according to example embodiments of the present disclosure.

FIG. 7 depicts an example system 100 for monitoring the bank of ultracapacitors 72 according to example embodiments of the present disclosure. The system 100 can include a first switching element 110, such as one or more relays, transistors, or other switching elements that can be controlled to be in a conducting state or non-conducting state. In example embodiments, a control device 60 of the system 100 can be configured to control operation of the first switching element 110 to selectively couple the bank of ultracapacitors 72 to a resistive load 120 of the system 100. In some embodiments, the resistive load 120 can be the secondary power converter 88 (FIG. 4) coupled between the bank of ultracapacitors 72 and the pitch motor 33 (FIG. 4) of the pitch drive mechanisms 32 (FIG. 4). When the bank of ultracapacitors 72 is coupled to the resistive load 120 via the first switching element 110, it should be appreciated that the bank of ultracapacitors 72 discharges electrical power (e.g. DC power) through the resistive load 120.

As shown, the system 100 can include a second switching element 112, such as one or more relays, transistors, or other switching elements that can be controlled to be in a conducting state or non-conducting state. In example embodiments, the control device 60 can be configured to control operation of the second switching element 112 to selectively couple the bank of ultracapacitors 72 to a charging circuit 130 of the system 100. In some embodiments, the charging circuit 130 can be the DC/DC power converter 84 (FIG. 5) of the primary power converter 76 (FIG. 5). When the bank of ultracapacitors 72 is coupled to the charging circuit 130, it should be appreciated that electrical power (e.g., DC power) can be delivered from the charging circuit 130 to the bank of ultracapacitors 72. In this manner, the bank of ultracapacitors 72 can be charged from a first voltage to a second voltage that is greater than the first voltage.

Figure 8:
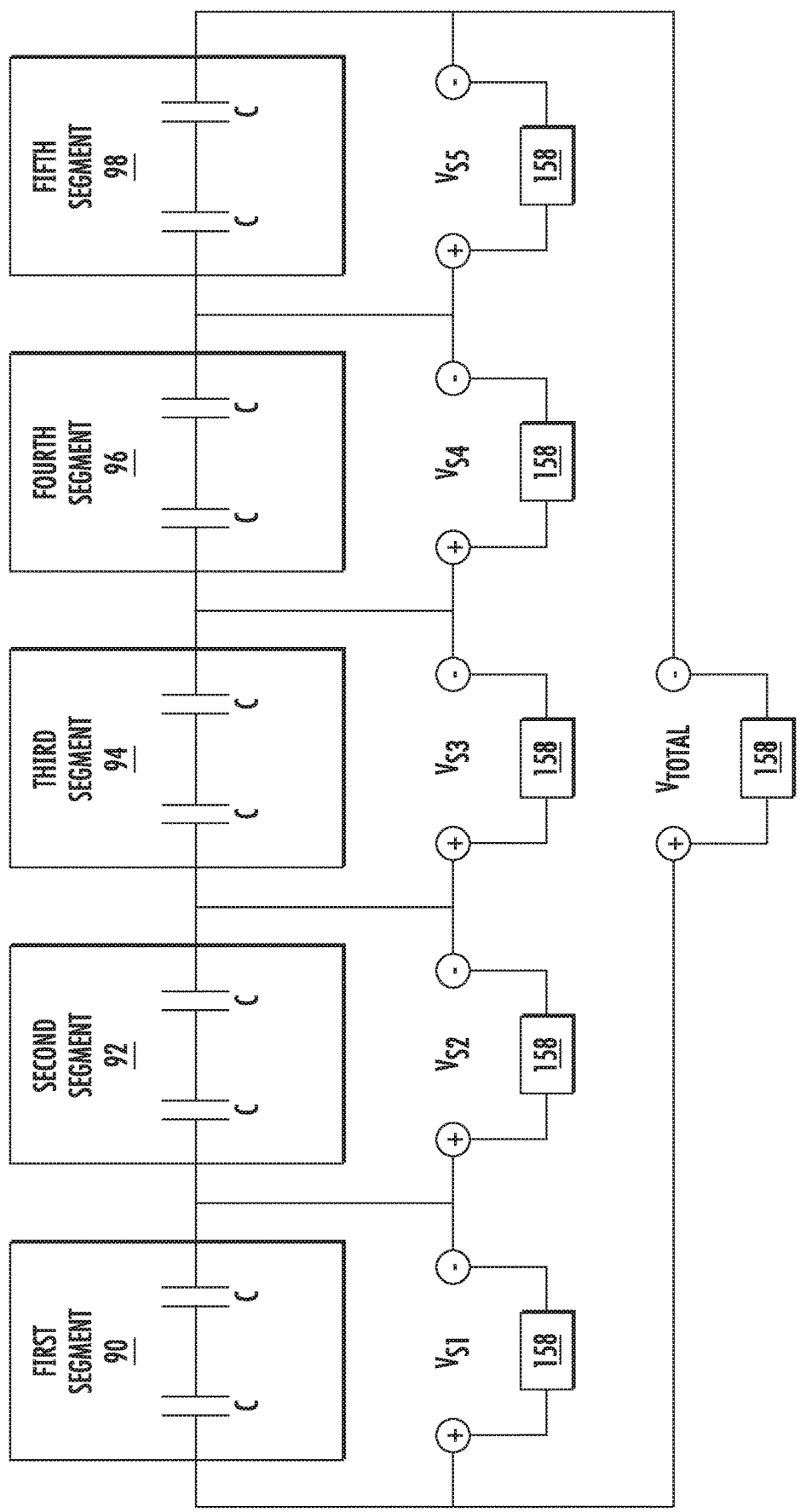
FIG. 8 depicts sensors of the system of FIG. 7 configured to monitor voltages associated with the bank of ultracapacitors according to example embodiments of the present disclosure.

Referring now to FIGS. 7 and 8 in combination, the system 100 can include one or more voltage sensors 158. As shown, the one or more voltage sensors 158 can be configured to monitor various voltages associated with the bank of ultracapacitors 72. For instance, the one or more voltage sensors 158 can be configured to monitor a voltage associated with each segment of the plurality of segments (e.g., first segment 90, second segment 92, third segment 94, fourth segment 96, and fifth segment 98). More specifically, voltage sensors 158 can be configured to monitor a first voltage $V_{s1}$ associated with the first segment 90, a second voltage $V_{s2}$ associated with the second segment 92, a third voltage $V_{s3}$ associated with the third segment 94, a fourth voltage $V_{s4}$ associated with the fourth segment 96, and a fifth voltage $V_{s5}$ associated with the fifth segment 98. Alternatively and/or additionally, a voltage sensor 158 can be configured to monitor a total voltage $V_{TOTAL}$ of the bank of ultracapacitors 72. In some embodiments, the total voltage $V_{TOTAL}$ monitored by the voltage sensor 158 can correspond to the summation of the voltages associated with each of the segments.

As shown, the system 100 can include a current sensor 159 configured to monitor an output current/discharge current ($I_L$) of the bank of ultracapacitors 72 through the resistive load 120. Additionally, the one or more voltage sensors 158 can be configured monitor an output voltage/discharge voltage $V_L$ of the bank of ultracapacitors 72 during discharge of the bank of ultracapacitors 72 through the resistive load 120. As will be discussed below in more detail, the control device 60 can be configured to determine a capacitance of the bank of ultracapacitors 72 based, at least in part, on the discharge current $I_L$ and a rate of discharge associated with the bank of ultracapacitors 72. For instance, the control device 60 can execute computer-readable instructions stored in a memory to perform operations to determine a capacitance of the bank of ultracapacitors 72.

Figure 9:
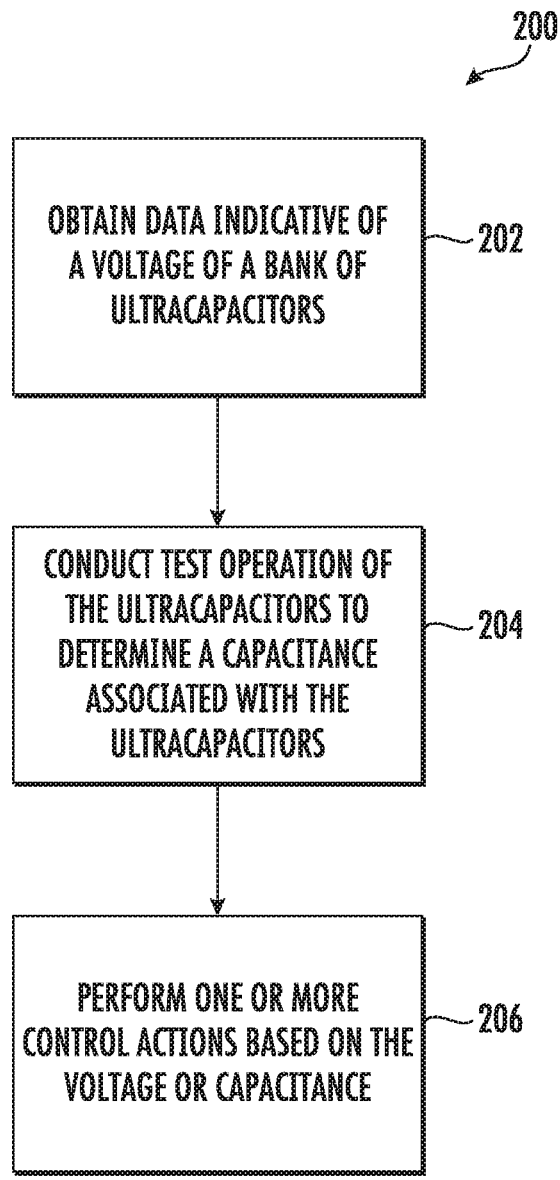
FIG. 9 depicts a flow diagram of an example method for monitoring a bank of ultracapacitors according to example embodiments of the present disclosure.

Referring now to FIG. 9, a flow diagram of a method 200 for monitoring a bank of ultracapacitors used to power a pitch system of a wind turbine is provided according to example embodiments of the present disclosure. It should be appreciated that the method 200 can be implemented using the any suitable control device (e.g., pitch controller) of the wind turbine discussed above with reference to FIGS. 1-3.

FIG. 9 depicts steps performed in a particular order for purposes of illustration and discussion. Those of ordinary skill in the art, using the disclosures provided herein, will understand that various steps of the method 200 may be adapted, modified, rearranged, performed simultaneously or modified in various ways without deviating from the scope of the present disclosure.

At (202), the method 200 includes obtaining, by one or more control devices, data indicative of a voltage associated with the bank of ultracapacitors. In example embodiments, the data can be indicative of a total voltage $V_{TOTAL}$ (FIG. 8) of the bank of ultracapacitors. Alternatively and/or additionally, the data can be indicative of a voltage (e.g., $V_{s1}$, $V_{s2}$, $V_{s3}$, $V_{s4}$, $V_{s5}$ of FIG. 8) associated with one or more segments of the plurality of segments included in the bank of ultracapacitors.

At (204), the method 200 includes conducting, by the one or more control devices, a test operation of the bank of ultracapacitors to determine a capacitance associated with the bank of ultracapacitors. The test operation can be conducted using, for instance, the system discussed above with reference to FIGS. 7 and 8. In some embodiments, the one or more control devices can be configured to conduct the test operation at predefined intervals of time.

At (206), the method 200 includes performing, by the one or more control devices, one or more control actions based on the voltage obtained at (202) or the capacitance determined at (204).

Figure 10:
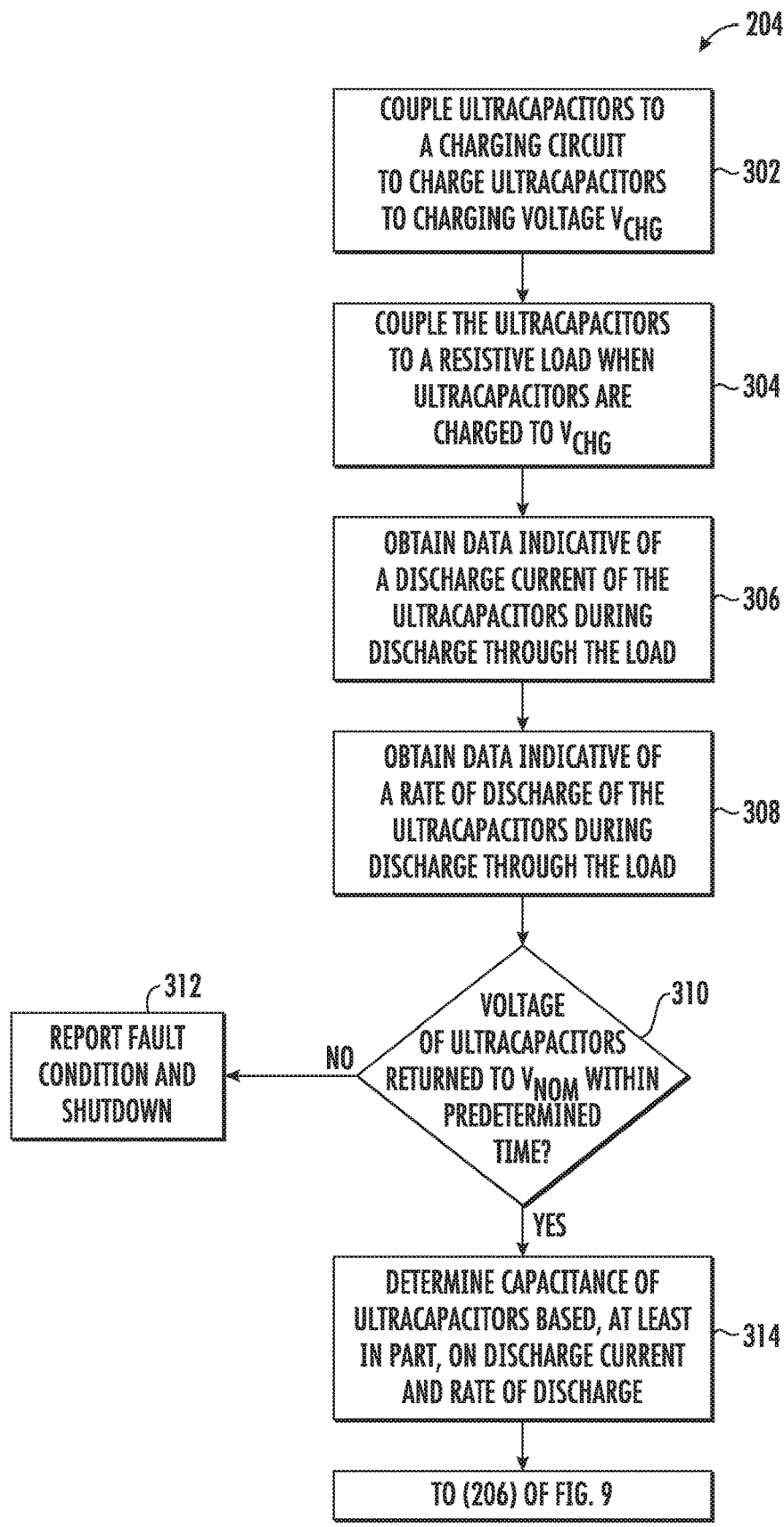
FIG. 10 depicts a flow diagram of a test operation to perform on a bank of ultracapacitors according to example embodiments of the present disclosure.

Referring now to FIG. 10, a flow diagram illustrating an example embodiment of the test operation performed at (204) of FIG. 9 is provided according to example embodiments of the present disclosure. It should be appreciated that any suitable control device (e.g., pitch controller) of the wind turbine discussed above with reference to FIGS. 1-3 can be configured to implement the test operation. It should also be appreciated that the system described above with reference to FIGS. 7 and 8 can be configured to implement the test operation.

At (302), the test operation includes coupling the bank of ultracapacitors to a charging circuit to charge the bank of ultracapacitors to a charging voltage $V_{CHG}$ that is greater than a nominal voltage $V_{NOM}$ by a predetermined amount (e.g., about 10 Volts). The nominal voltage $V_{NOM}$ can, in some embodiments, correspond to a voltage needed to operate the AC pitch motor of the pitch system. In example embodiments, the one or more control devices can be configured to perform a control action associated with controlling operation of a switching element used to selectively couple the bank of ultracapacitors to the charging circuit.

At (304), the test operation includes coupling the bank of ultracapacitors to a resistive load. In example embodiments, the one or more control devices can perform a control action associated with controlling operation of a switching element used to selectively couple the bank of ultracapacitors to the resistive load. When the bank of ultracapacitors is coupled to the resistive load, it should be appreciated that the bank of ultracapacitors can discharge through the resistive load.

At (306), the test operation includes obtaining, by the one or more control devices, data indicative of a discharge current of the bank of ultracapacitors during discharge through the load at (304). In example embodiments, the data indicative of the discharge current can be obtained from one or more current sensors of the system described above with reference to FIGS. 7 and 8.

At (308), the test operation includes obtaining, by the one or more control devices, data indicative of a rate of discharge of the bank of ultracapacitors during discharge through the load at (304). It should be appreciated that the rate of discharge of the bank of ultracapacitors can be a function of at least the resistive load.

At (310), the test operation includes determining, by the one or more control devices, whether the voltage of the bank of ultracapacitors returns to the nominal voltage $V_{NOM}$ within a predetermined amount of time after coupling the bank of ultracapacitors to the resistive load at (306). In example embodiments, the predetermined amount of time can be about 2 seconds. If the voltage of the bank of ultracapacitors does not return to the nominal voltage $V_{NOM}$ within the predetermined amount of time, the test operation proceeds to (312). Otherwise, the test operation proceeds to (314).

At (312), the test operation 300 includes performing, by the one or more control devices, a control action associated with providing a notification indicative of a fault condition associated with the bank of ultracapacitors. More specifically, the fault condition can indicate occurrence of a loss of capacitance requiring shutdown of the wind turbine. In such embodiments, the one or more control devices can be configured to perform an additional control action associated with shutting down the wind turbine. In this manner, potential harm to the bank of ultracapacitors or other components of the wind turbine can be avoided.

At (314), the test operation includes determining, by the one or more control devices, a capacitance of the bank of ultracapacitors based, at least in part, on the data indicative of the discharge current obtained at (306) and the data indicative of the rate of discharge of the bank of capacitors obtained at (308). In example embodiments, the capacitance can include a total capacitance $C_{TOTAL}$ of the bank of ultracapacitors. Alternatively and/or additionally, the capacitance can include a capacitance associated with each segment of the plurality of segments included in the bank of ultracapacitors. Upon determining the capacitance of the bank of ultracapacitors, the test operation concludes, and the one or more control devices can perform one or more control actions based, at least in part, on the capacitance determined at (314).

As an example, if the total capacitance $C_{TOTAL}$ determined at (314) is less than a first threshold value (e.g., about 82 percent of a nominal capacitance $C_{NOM}$ associated with the bank of ultracapacitors), then the one or more control actions performed at (206) of FIG. 9 can include a control action associated with providing a notification or alert indicating a loss of capacitance associated with the bank of ultracapacitors. In some embodiments, the notification or alert can indicate a maintenance action (e.g., repair or replace) needs to be performed on the bank of ultracapacitors.

As another example, if the total capacitance $C_{TOTAL}$ determined at (314) is less than a second threshold value (e.g., about 80 percent of the nominal capacitance $C_{NOM}$), then the one or more control actions performed at (206) can include a first control action associated with providing a notification indicating a fault condition associated with the bank of ultracapacitors. More specifically, the fault condition can correspond to a loss of capacitance fault condition requiring shutdown of the wind turbine. In addition, the one or more control actions performed at (206) can include a second control action associated with shutting down the wind turbine.

As yet another example, if, at (314), the capacitance determined for one or more segments of the plurality of segments of the bank of ultracapacitors is less than about 20 percent of the nominal capacitance, then the one or more control actions performed at (206) can include a first control action associated with providing a notification indicating a fault condition associated with the bank of ultracapacitors. More specifically, the fault condition can correspond to a loss of capacitance fault condition requiring shutdown of the wind turbine. In addition, the one or more control actions performed at (206) can include a second control action associated with shutting down the wind turbine.

Figure 11:
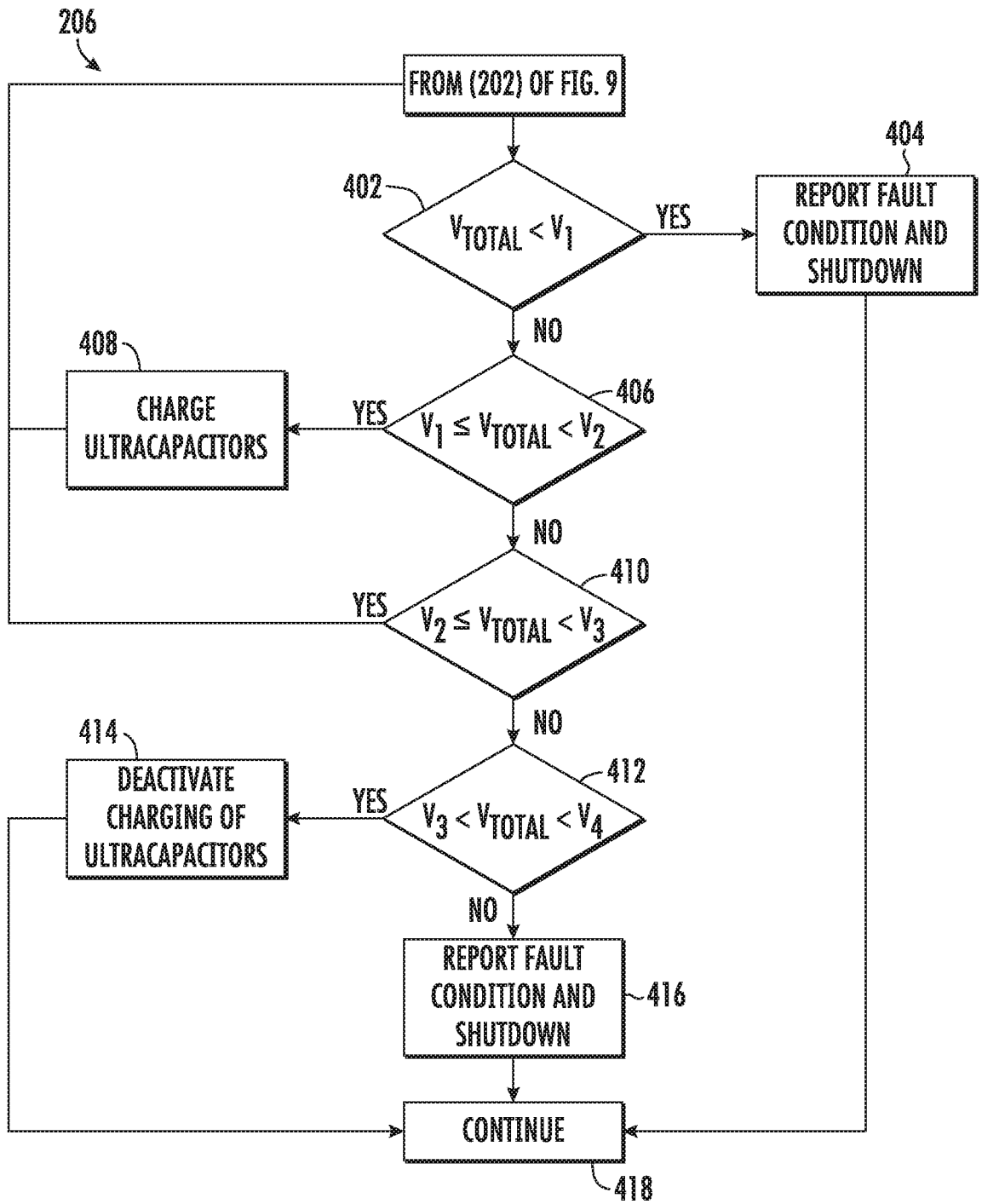
FIG. 11 depicts a flow diagram of an example method according to example embodiments of the present disclosure.

Referring now to FIG. 11, a flow diagram of a method for determining one or more control actions to perform at (206) of FIG. 9 is provided according to example embodiments of the present disclosure. It should be appreciated that any suitable control device (e.g., pitch controller) of the wind turbine discussed above with reference to FIGS. 1-3 can implement the one or more control action depicted in FIG. 11.

At (402), the method includes determining, by the one or more control devices, whether the total voltage $V_{TOTAL}$ obtained at (202) of FIG. 9 is less than a first threshold voltage $V_1$ indicative of performance of the bank of ultracapacitors. In example embodiments, the first threshold voltage $V_1$ can correspond to a voltage needed to operate a pitch motor of the pitch system. For instance, the first threshold voltage can be about 470 Volts. If the total voltage $V_{TOTAL}$ is less than the first threshold voltage $V_1$, the method proceeds to (404). Otherwise, the method proceeds to (406).

At (404), the method includes performing, by the one or more control devices, a first control action associated with providing a notification indicative of a fault condition associated with the bank of ultracapacitors. More specifically, the fault condition can indicate occurrence of an undervoltage condition associated with the bank of ultracapacitors. Additionally, the method includes performing a second control action associated with shutting down the wind turbine to avoid potential harm to the bank of ultracapacitors. After performing these control actions, the method continues at (418).

At (406), the method includes determining, by the one or more control devices, whether the total voltage $V_{TOTAL}$ is less a second threshold voltage $V_2$ that is greater than the first threshold voltage $V_1$. In example embodiments, the second threshold voltage $V_2$ can be about 478 volts. If the total voltage $V_{TOTAL}$ is less than the second threshold voltage $V_2$, the flow diagram proceeds to (408). Otherwise, the method proceeds to (410).

At (408), the method includes performing, by the one or more control devices, a control action associated with charging the bank of ultracapacitors. In example embodiments, the control action can be associated with controlling operation of a switching element used to selectively couple the bank of ultracapacitors to the charging circuit. In this manner, the charging circuit can deliver electrical power (e.g., DC power) to the bank of ultracapacitors. Once the bank of ultracapacitors is coupled to the charging circuit, the flow diagram reverts to (202) of FIG. 9 to obtain additional voltage readings.

At (410), the method includes determining, by the one or more control devices, whether the total voltage $V_{TOTAL}$ is less than a third threshold voltage $V_3$ that is greater than the second threshold voltage $V_2$. In example embodiments, the third threshold voltage $V_3$ can indicate the bank of ultracapacitors is fully charged. For instance, the third threshold voltage $V_3$ can be about 482 Volts. If the total voltage $V_{TOTAL}$ is less than the third threshold voltage $V_3$, the flow diagram reverts to (202) of FIG. 9. It should be appreciated that the bank of ultracapacitors can remain coupled to the charging circuit until the total voltage $V_{TOTAL}$ of the bank of ultracapacitors is at least greater than the third threshold voltage $V_3$.

At (412), the method includes determining, by the one or more control devices, whether the total voltage $V_{TOTAL}$ is greater than a fourth threshold voltage that is greater than the third threshold voltage $V_3$. In example embodiments, the fourth threshold voltage $V_4$ can correspond to a design voltage for the bank of ultracapacitors. For instance, in some embodiments, the fourth threshold voltage $V_4$ can be about 520 Volts. In example embodiments, the design voltage can be less than a rated voltage of the bank of ultracapacitors. If the total voltage $V_{TOTAL}$ is not greater than the fourth threshold voltage $V_4$, the method proceeds to (414). Otherwise the method proceeds to (416).

At (414), the method includes performing, by the one or more control devices, a control action associated with decoupling the bank of ultracapacitors from the charging circuit. In example embodiments, the control action can be associated with controlling operation of a switching element (e.g., second switching element of FIG. 7) used to selectively couple the bank of ultracapacitors to the charging circuit. Once the bank of ultracapacitors are decoupled from the charging circuit via operation of the switching element, the method proceeds to (418).

At (416), the method includes performing, by the one or more devices, a first control action associated with providing a notification indicative of a fault condition associated with the bank of ultracapacitors. More specifically, the fault condition can indicate occurrence of an overvoltage condition requiring the wind turbine be shutdown. As such, the method can further include performing a second control action associated with shutting down the wind turbine to avoid potential harm to the bank of ultracapacitors. After performing these notifications at (416), the method continues at (418).

At (418), the method may continue. For instance, the method may revert to (402) after a predetermined amount of time lapses. In this manner, the method can be conducted multiple times to reduce or eliminate scenarios in which a grid loss occurs and the bank of ultracapacitors is unable to pitch the blades as needed.

Figure 12:
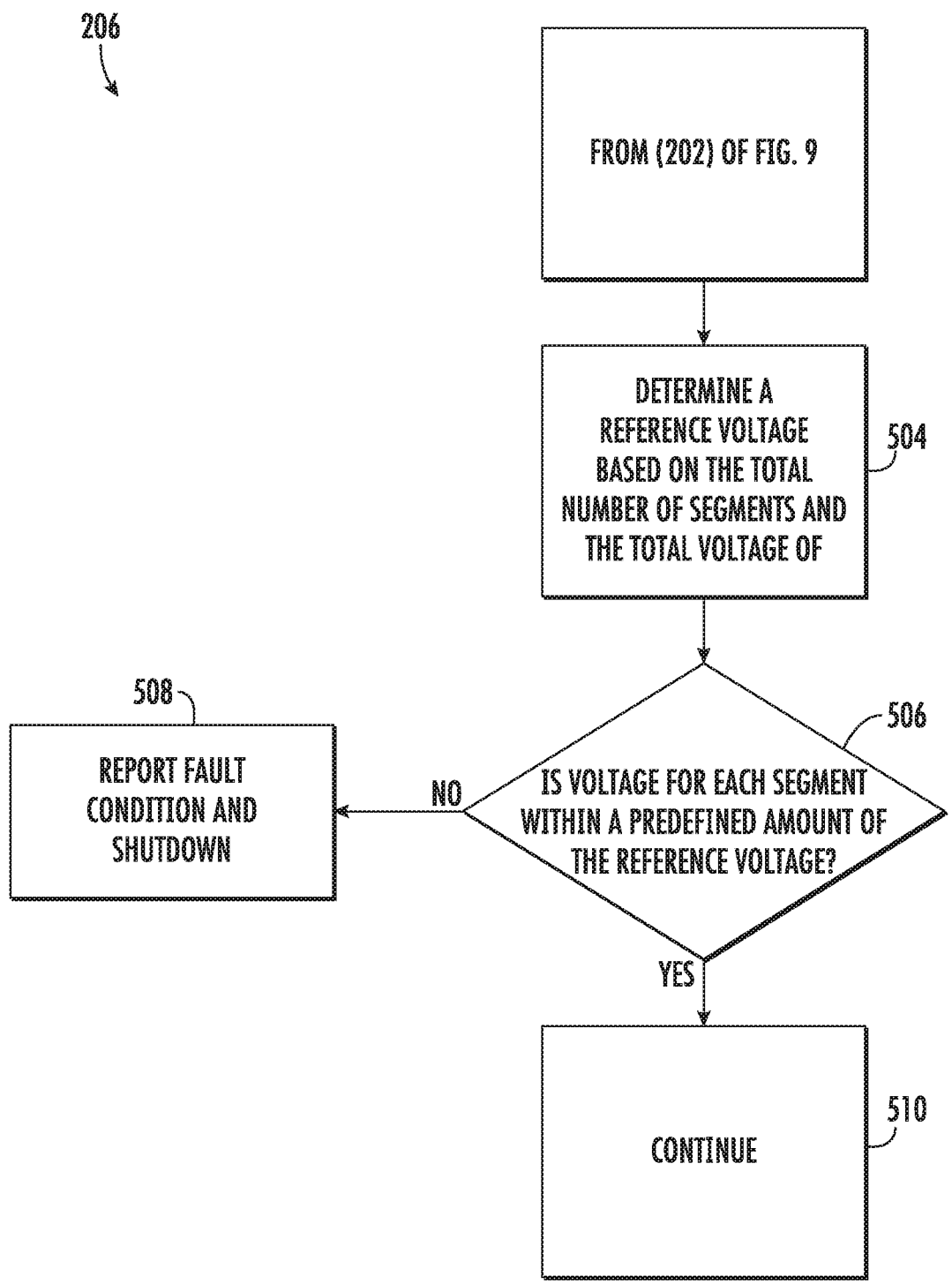
FIG. 12 depicts a flow diagram of an example method according to example embodiments of the present disclosure.

Referring now to FIG. 12, a flow diagram of a method for determining one or more control actions to perform at (206) of FIG. 9 is provided according to example embodiments of the present disclosure. It should be appreciated that the method can be implemented using the any suitable control device (e.g., pitch controller) of the wind turbine discussed above with reference to FIGS. 1-3.

At (502), the method includes obtaining, by the one or more control devices, a voltage associated with one or more segments of the plurality of segments included in the bank of ultracapacitors. In example embodiments, the voltage associated with each of the plurality of segments can be obtained via the voltage sensors of the system described above with reference to FIGS. 7 and 8.

At (504), the method includes determining, by the one or more control devices, a reference voltage $V_{REF}$ based, at least in part, on the total voltage $V_{TOTAL}$ of the bank of ultracapacitors and the total number of segments N included in the bank of ultracapacitors. For instance, the reference voltage can be calculated as shown below in Equation 1:

$$V_{REF} = \frac{VTOTAL}{N} \qquad \text{Equation 1}$$

At (506), the method includes determining, by the one or more control devices, whether any of the voltages obtained at (502) for each of the plurality of segments differs from the reference voltage by more than a predefined amount. I example embodiments, the predefined amount can be about 10 percent. If any of the voltages differ from the reference voltage by more than the predefined amount, the method proceeds to (508). Otherwise, the method proceeds to (510).

At (508), the method includes performing, by the one or more devices, a control action associated with providing a notification indicative of a fault condition associated with the bank of ultracapacitors. In some embodiments, the notification can indicate a maintenance action (e.g., repair or replace) needs to be performed on the bank of ultracapacitors. In alternative embodiments, the fault condition can correspond to a loss of capacitance fault condition requiring shutdown of the wind turbine. In such embodiments, the method includes performing an additional control action associated with shutting the wind turbine down to avoid potential harm to the bank of ultracapacitors. After performing the one or more control actions, the method continues at (510).

Figure 13:
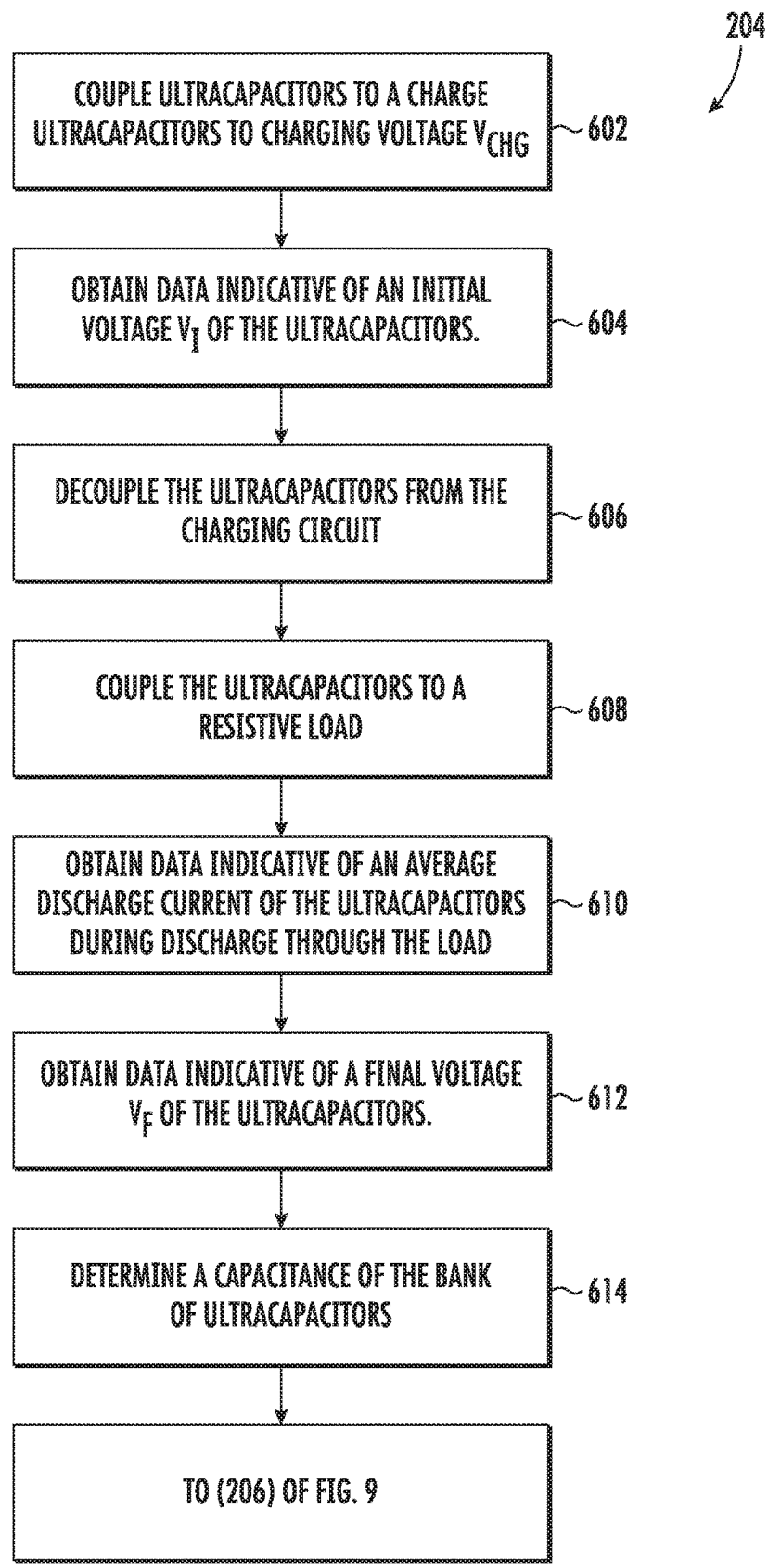
FIG. 13 depicts a flow diagram of another test operation to perform on a bank of ultracapacitors according to example embodiments of the present disclosure.

At (510), the method may continue. For example, the method may revert to (502) after a predetermined amount of time lapses. In this manner, the method can be conducted multiple times to reduce or eliminate scenarios in which a grid loss occurs and the bank of ultracapacitors is unable to pitch the blades as needed. Referring now to FIG. 13, a flow diagram of another example embodiment of the test operation performed at (204) of FIG. 9 is provided according to the present disclosure. It should be appreciated that any suitable control device (e.g., pitch controller) of the wind turbine discussed above with reference to FIGS. 1-3 can be configured to implement the test operation of FIG. 13. It should also be appreciated that the system described above with reference to FIGS. 7 and 8 can be used to implement the test operation. Also, although FIG. 13 depicts steps performed in a particular order for purposes of illustration and discussion, those of ordinary skill in the art, using the disclosures provided herein, will understand that various steps of the test operation may be adapted, modified, rearranged, performed simultaneously or modified in various ways without deviating from the scope of the present disclosure.

At (602), the test operation includes coupling the bank of ultracapacitors to a charging circuit to charge the bank of ultracapacitors to a charging voltage $V_{CHG}$. In example embodiments, the charging voltage $V_{CHG}$ can be greater than a nominal voltage $V_{NOM}$ by a predetermined amount (e.g., about 10 Volts). The nominal voltage $V_{NOM}$ can, in some embodiments, correspond to a voltage needed operate a pitch motor of the pitch system. In example embodiments, the one or more control devices can be configured to generate a control action associated with controlling operation of a switching element used to selectively couple the bank of ultracapacitors to the charging circuit. In this manner, the bank of ultracapacitors can be coupled to the charging circuit via the switching element. After the bank of ultracapacitors is charged to the charging voltage $V_{CHG}$, the test operation proceeds to (604).

At (604), the test operation includes obtaining data indicative of an initial voltage $V_1$ associated with the ultracapacitor. In example embodiments, the initial voltage $V_1$ can correspond to a total voltage (e.g., $V_{TOTAL}$ of FIG. 8) of the bank of ultracapacitors. Alternatively and/or additionally, the data can be indicative of a voltage (e.g., $V_{s1}$, $V_{s2}$, $V_{s3}$, $V_{s4}$, $V_{s5}$ of FIG. 8) associated with one or more segments of the plurality of segments included in the bank of ultracapacitors. Upon obtaining the data indicative of the initial voltage $V_1$, the test operation proceeds to (606).

At (606), the test operation includes decoupling the bank of ultracapacitors from the charging circuit. In example embodiments, the one or more control devices can be configured to generate a control action associated with control operation of the switching element (e.g., second switch 112 of FIG. 7) used to selectively couple the bank of ultracapacitors to the charging circuit. In this manner, the bank of ultracapacitors can be decoupled from the charging circuit.

At (608), the test operation includes coupling the bank of ultracapacitors to the resistive load for a predetermined amount of time. In example embodiments, the one or more control devices can generate a control action associated with controlling operation of a switching element (e.g., first switch 110 of FIG. 7) used to selectively couple the bank of ultracapacitors to the resistive load. In this manner, the bank of ultracapacitors can be coupled to the resistive load via the switching element. When the bank of ultracapacitors is coupled to the resistive load via the switching element, it should be appreciated that the bank of ultracapacitors discharges through the resistive load.

At (610), the test operation includes obtaining data indicative of an average discharge current $I_{AVG}$ of the bank of ultracapacitors during discharge through the resistive load. In example embodiments, the one or more control devices can obtain the data indicative of the average discharge current $I_{AVG}$ via one or more current sensors (e.g., current sensor 159 of FIG. 7). After the bank of ultracapacitors has been coupled to the resistive load for the predetermined amount of time, the test operation proceeds to (612).

At (612), the test operation includes obtaining data indicative of a final voltage $V_F$ associated with the bank of ultracapacitors. In example embodiments, the data indicative of the final voltage $V_F$ can correspond to the total voltage (e.g., $V_{TOTAL}$ of FIG. 8) of the bank of ultracapacitors. Alternatively and/or additionally, the data indicative of the final voltage $V_F$ can correspond to a voltage (e.g., $V_{s1}$, $V_{s2}$, $V_{s3}$, $V_{s4}$, $V_{s5}$, of FIG. 8) associated with one or more segments of the plurality of segments included in the bank of ultracapacitors. Upon obtaining the data indicative of the final voltage $V_F$, the test operation proceeds to (614).

At (614), the test operation includes determining a capacitance of the bank of ultracapacitors. For example, the capacitance can be indicative of a total capacitance $C_{TOTAL}$ of the bank of ultracapacitors. More specifically, the total capacitance can be determined as shown below in Equation 2:

$$C_{TOTAL} = \frac{t*IAVG}{VTF - VTI} \qquad \text{Equation 2}$$

where t corresponds to the predetermined amount of time the bank of ultracapacitors is coupled to the resistive load, $I_{AVG}$ corresponds to the average discharge current of the bank of ultracapacitors during discharge through the resistive load, $V_{TF}$ corresponds to the final total voltage obtained at (612), and $V_{TI}$ corresponds to the initial total voltage obtained at (604).

Alternatively and/or additionally, the capacitance determined at (614) can be indicative of a capacitance $C_S$ associated with one or more segments of the plurality of segments included in the bank of ultracapacitors. More specifically, the capacitance $C_S$ for a segment S of the bank of ultracapacitors can be determined as shown below in Equation 3:

$$C_S = \frac{t*IAVG}{VTF - VSI} \qquad \text{Equation 3}$$

where $V_{SF}$ corresponds to the final voltage obtained for the segment S at (612), and $V_{SI}$ corresponds to the initial voltage obtained for the segment S at (604). After determining the capacitance (e.g., $C_{TOTAL}$ and/or $C_S$) at (614), the test operation concludes, and the one or more control devices can perform one or more control actions based, at least in part, on the capacitance determined at (614). Alternatively and/or additionally, the test operation can revert to (602).

As an example, if the total capacitance $C_{TOTAL}$ determined at (614) is less than a first threshold value (e.g., about 82 percent of a nominal capacitance $C_{NOM}$ associated with the bank of ultracapacitors), then the one or more control actions performed at (206) of FIG. 9 can include a control action associated with providing a notification or alert indicating a loss of capacitance associated with the bank of ultracapacitors. In some embodiments, the notification or alert can indicate a maintenance action (e.g., repair or replace) needs to be performed on the bank of ultracapacitors.

As another example, if the total capacitance $C_{TOTAL}$ determined at (614) is less than a second threshold value (e.g., about 80 percent of the nominal capacitance $C_{NOM}$), the one or more control actions performed at (206) can include a first control action associated with providing a notification indicating a fault condition associated with the bank of ultracapacitors. More specifically, the fault condition can correspond to a loss of capacitance fault condition requiring shutdown of the wind turbine. In addition, the one or more control actions performed at (206) can include a second control action associated with shutting down the wind turbine.

As yet another example, if, at (614), the capacitance determined for one or more segments of the plurality of segments of the bank of ultracapacitors is less than about 20 percent of the nominal capacitance, the one or more control actions performed at (206) can include a first control action associated with providing a notification indicating a fault condition associated with the bank of ultracapacitors. More specifically, the fault condition can correspond to a loss of capacitance fault condition requiring shutdown of the wind turbine. In addition, the one or more control actions performed at (206) can include a second control action associated with shutting down the wind turbine.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for monitoring a bank of ultracapacitors configured to power an alternating current (AC) pitch motor of a pitch system in a wind turbine, the bank of ultracapacitors comprising a plurality of segments, each segment of the plurality of segments comprising one or more ultracapacitors, the method comprising:
   obtaining, by one or more control devices, data indicative of a voltage associated with the ultracapacitors comprising data indicative of a total voltage across the ultracapacitors;
   conducting, by the one or more control devices, a test operation of the ultracapacitors at predetermined intervals of time to determine a capacitance associated with the ultracapacitors; and
   performing, by the one or more control devices, one or more control actions based, at least in part, on the capacitance or the data indicative of the voltage, wherein when the total voltage is less than a first threshold voltage indicative of a voltage needed to operate the AC pitch motor, performing one or more control actions based on the total voltage comprises performing at least one of a first control action and a second control action, the first control action associated with providing a notification indicative of a fault condition associated with the ultracapacitors, the second control action associated with shutting down the wind turbine.

2. The method of claim 1, wherein when the total voltage is greater than the first threshold voltage but less than a second threshold voltage indicative of the ultracapacitors being fully charged, performing one or more control actions based on the total voltage comprises performing a control action associated with coupling the ultracapacitors to a charging circuit to charge the ultracapacitors.

3. The method of claim 1, wherein when the total voltage is greater than a threshold voltage indicative of a design voltage for the ultracapacitors, performing one or more control actions based on the total voltage comprises performing at least one of a first control action and a second control action, the first control action associated with providing a notification indicative of a fault condition associated with the ultracapacitors, the second control action associated with shutting down the wind turbine.

4. The method of claim 1, wherein the data indicative of the voltage further comprises data indicative of a voltage associated with one or more segments of the plurality of segments of the ultracapacitors.

5. The method of claim 4, wherein the method further comprises:
   determining, by the one or more control devices, a reference voltage based, at least in part, on the number of segments included in the ultracapacitors and the total voltage of the ultracapacitors; and
   determining, by the one or more control devices, whether or not the voltage associated with one or more segments of the plurality of segments differs from the reference voltage by more than the predetermined amount.

6. The method of claim 5, wherein when the voltage associated with one or more segments of the plurality of segments differs from the reference voltage by more than the predetermined amount, performing one or more control actions based on the voltage associated with each segment of the plurality of segments comprises performing a control action associated with providing a notification indicative of a fault condition associated with the ultracapacitors.

7. The method of claim 1, wherein conducting the test operation of the ultracapacitors comprises:
   coupling the ultracapacitors to a charging circuit to charge the ultracapacitors to a charging voltage that is greater than a nominal voltage of the ultracapacitors by a predefined amount;
   responsive to charging the ultracapacitors to the charging voltage, coupling the ultracapacitors to a resistive load such that the ultracapacitors discharge through the load;
   obtaining, by the one or more control devices, data during discharge through the load, the data indicative of at least one of a rate of discharge of the ultracapacitors and a discharge current of the ultracapacitors; and
   determining, by the one or more control devices, the capacitance associated with the ultracapacitors based, at least in part, on the data obtained during discharge through the load.

8. The method of claim 7, further comprising determining, by the one or more control devices, whether discharging the ultracapacitors through the load reduces a voltage of the ultracapacitors to the nominal voltage within a predetermined amount of time after coupling the ultracapacitors to the load.

9. The method of claim 8, wherein determining the capacitance associated with the ultracapacitors occurs in response to determining the voltage of the ultracapacitors returns to the nominal voltage within the predetermined amount of time.

10. The method of claim 1, wherein conducting the test operation of the ultracapacitors comprises:
   coupling the ultracapacitors to a charging circuit to charge the ultracapacitors to a charging voltage;
   responsive to charging the ultracapacitors to the charging voltage, obtaining, by the one or more control devices, data indicative of an initial voltage associated with the ultracapacitors;
   responsive to obtaining the data indicative of the initial voltage, coupling the ultracapacitors to a resistive load for a predetermined amount of time such that the ultracapacitors discharges through the resistive load;
   obtaining, by the one or more control devices, data during discharge through the load, the data indicative of an average discharge current of the ultracapacitors;
   responsive to expiration of the predetermined amount of time, obtaining, by the one or more control devices, data indicative of a final voltage associated with the ultracapacitors, the final voltage being less than the initial voltage; and determining, by the one or more control devices, a capacitance of the ultracapacitors based on the initial voltage, the predetermined amount of time, the average discharge current, and the final voltage.

11. The method of claim 10, wherein conducting the test operation of the ultracapacitors further comprises performing, by the one or more control devices, one or more control actions based, at least in part, on the capacitance of the ultracapacitors.

12. A system for monitoring operation of a bank of ultracapacitors configured to power an alternating current (AC) motor of a pitch system in a wind turbine, the ultracapacitors comprising a plurality of segments, the system comprising:

a charging circuit;

a resistive load;

a current sensor configured to measure a discharge current of the ultracapacitors; and a control device having one or more processors configured to execute computer-readable instructions stored in one or more memory devices to perform operations, the operations comprising:

coupling the ultracapacitors to the charging circuit to charge the ultracapacitors to a charging voltage;

obtaining data indicative of an initial voltage of the ultracapacitors subsequent to charging the ultracapacitors to the charging voltage;

responsive to charging the ultracapacitors to the charging voltage, coupling the ultracapacitors to the resistive load to discharge the ultracapacitors through the resistive load;

obtaining, via the current sensor, data indicative of a discharge current of the ultracapacitors during discharge through the load;

determining a capacitance of the ultracapacitors based, at least in part, on the discharge current; and performing one or more control actions based, at least in part, on the capacitance.

13. The system of claim 12, wherein the operations further comprise obtaining data indicative of a final voltage of the ultracapacitors after the ultracapacitors have been coupled to the resistive load for a predetermined amount of time.

14. The system of claim 13, wherein the data indicative of the discharge current comprises an average discharge current.

15. The system of claim 14, wherein the capacitance is determined based, at least in part, on the initial voltage, the predetermined amount of time, the average discharge current, and the final voltage.

16. The system of claim 12, wherein the capacitance comprises a total capacitance of the ultracapacitors.

17. The system of claim 16, wherein when the total capacitance is less than a nominal capacitance indicative of a capacitance needed to operate the AC pitch motor of the pitch system, the one or more control actions comprise a control action associated with providing a notification indicating a maintenance action needs to be performed on the ultracapacitors.

* * * * *